(12) United States Patent
Miyakawa et al.

(10) Patent No.: US 9,831,567 B2
(45) Date of Patent: Nov. 28, 2017

(54) CRIMP TERMINAL HAVING A CONDUCTOR CRIMPING PART WITH AN INTERMEDIATE MATERIAL WITH RECESSED PARTS AND A THIN-FILM LAYER ON ITS TOP

(71) Applicants: YAZAKI CORPORATION, Tokyo (JP); Toppan Printing Co., Ltd., Tokyo (JP)

(72) Inventors: Daisuke Miyakawa, Shizuoka (JP); Koichi Kumai, Tokyo (JP)

(73) Assignees: YAZAKI CORPORATION, Tokyo (JP); Toppan Printing Co., Ltd., Tokyo (JP)

( * ) Notice: Subject to any disclaimer, the term of this patent is extended or adjusted under 35 U.S.C. 154(b) by 0 days.

(21) Appl. No.: 15/224,756

(22) Filed: Aug. 1, 2016

(65) Prior Publication Data

US 2017/0040713 A1    Feb. 9, 2017

(30) Foreign Application Priority Data

Aug. 3, 2015   (JP) ................. 2015-153072

(51) Int. Cl.
*H01R 4/10*       (2006.01)
*H01R 4/18*       (2006.01)
(Continued)

(52) U.S. Cl.
CPC .......... *H01R 4/188* (2013.01); *C23C 28/023* (2013.01); *H01R 13/03* (2013.01); *H01R 4/185* (2013.01); *H01R 4/62* (2013.01); *H01R 43/16* (2013.01)

(58) Field of Classification Search
CPC .......... H01R 4/18; H01R 4/185; H01R 4/186; H01R 4/187; H01R 4/188; H01R 13/03
(Continued)

(56) References Cited

U.S. PATENT DOCUMENTS 3,963,857 A * 6/1976 Reynolds ................. H01F 5/04
174/84 C
2011/0003518 A1   1/2011 Ono et al.
(Continued)

FOREIGN PATENT DOCUMENTS

JP      2009-283288 A   12/2009
JP      4996553 B2      8/2012
(Continued)

OTHER PUBLICATIONS

The office action dated Jul. 11, 2017 in the counterpart Japanese patent application.
(Continued)

*Primary Examiner* — Chandrika Prasad
(74) *Attorney, Agent, or Firm* — Metrolexis Law Group, PLLC

(57) ABSTRACT

In a manufacturing method of an aluminum wire crimp terminal formed by a base material made of a copper-based metal, at the step of forming an intermediate worked material having an unfolded shape of the crimp terminal, fine recessed parts for promoting the adhesive performance of the crimp terminal against a conductor of the wire are formed on a plate-body surface forming an inner face of a conductor crimping part of the intermediate worked material. Subsequently, a thin-film surface layer made of an aluminum-based metal is formed on at least the plate-body surface. Finally, the intermediate worked material is bent to a prescribed terminal shape.

12 Claims, 3 Drawing Sheets

(51) Int. Cl.
  *C23C 28/02* (2006.01)
  *H01R 13/03* (2006.01)
  *H01R 43/16* (2006.01)
  *H01R 4/62* (2006.01)

(58) Field of Classification Search
  USPC .......................................... 439/877, 882, 886
  See application file for complete search history.

(56) References Cited

U.S. PATENT DOCUMENTS

| | | | | |
|---|---|---|---|---|
| 2011/0294368 A1* | 12/2011 | Nakata | ................ | H01R 13/03 439/887 |
| 2012/0329342 A1* | 12/2012 | Sato | ................ | H01R 4/184 439/866 |
| 2013/0130565 A1* | 5/2013 | Onuma | ................ | H01R 4/188 439/877 |
| 2013/0130566 A1* | 5/2013 | Onuma | ................ | H01R 4/185 439/877 |
| 2014/0106628 A1* | 4/2014 | Sato | ................ | H01R 4/206 439/877 |
| 2015/0188244 A1* | 7/2015 | Yoshioka | ................ | H01M 2/20 439/442 |
| 2015/0244106 A1* | 8/2015 | Miyakawa | ................ | H01R 13/113 439/345 |
| 2016/0264533 A1* | 9/2016 | Nomura | ................ | H01B 7/2806 |
| 2017/0025769 A1* | 1/2017 | Tokunaga | ................ | H01R 4/184 |

FOREIGN PATENT DOCUMENTS

| | | |
|---|---|---|
| JP | 2013-020862 A | 1/2013 |
| JP | 2014-164926 A | 9/2014 |

OTHER PUBLICATIONS

The decision of refusal dated Sep. 19, 2017 in the counterpart Japanese patent application.

\* cited by examiner

CRIMP TERMINAL HAVING A CONDUCTOR CRIMPING PART WITH AN INTERMEDIATE MATERIAL WITH RECESSED PARTS AND A THIN-FILM LAYER ON ITS TOP

CROSS REFERENCE TO RELATED APPLICATION

The present application is based on, and claims priority from Japanese Patent Application No. 2015-153072, filed Aug. 3, 2015, the disclosure of which is hereby incorporated by reference herein in its entirety.

BACKGROUND

Technical Field

The present invention relates to a crimp terminal for aluminum wire or the like and manufacturing method of the crimp terminal, an electric wire assembly, and a wire harness.

Related Art

In general, a crimp terminal (male terminal or female terminal) used in a connector or the like is formed of a metal material where tin-plating is applied to a base material of copper or copper alloy. Then, a male type crimp terminal includes, on its front side, a tab part which can make a conductive contact with a mating female terminal since the tab part is fitted to the mating female terminal. The male type crimp terminal also includes, on its rear side, a conductor crimping part and a cover crimping part serving as a connecting part for electric wire. Further, a female type crimp terminal includes, on its front side, an electrical contact part having a cylindrical shape which can make a conductive contact with a mating male terminal when a tab part of the mating male terminal is inserted into the electrical contact part. The female-side crimp terminal also includes, on its rear side, a conductor crimping part and a cover crimping part serving as a connecting part for electric wire.

Recently, meanwhile, there has been widely employed an aluminum wire where a bundle of strands made of an aluminum-based metal is used for a conductor (core wire) from a viewpoint of weight reduction view. Correspondingly, an aluminum wire crimp terminal is proposed as well.

For the aluminum wire crimp terminal, there is known a terminal where a primary plating layer (tin or the like) is formed on a base material of copper or copper alloy and furthermore, a high-hardness plating layer having a higher hardness than that of the primary plating layer is formed on the primary plating layer (see JP2009-283288 A). For this high-hardness plating layer, there are the examples of metallic materials having a higher hardness than that of tin-based metal such as tungsten, aluminum, nickel, zinc, chrome, molybdenum, cobalt, etc.

Further, for the purpose of improving the adhesive performance between a metal forming a crimp terminal and an aluminum conductor of an aluminum wire, it is frequently executed to form fine irregularities, such as serrations, on the inner surface of the conductor crimping part of the crimp terminal.

SUMMARY

By the way, if an aluminum-based metal is adopted for the material of the high-hardness plating layer, there is an advantage of avoiding a problem of electrolytic corrosion due to contact surfaces made of different kinds of metals because the contact between the inner surface of the conductor crimping part of the crimp terminal and the aluminum conductor of the aluminum wire is accomplished by respective contact surfaces made of the same kind of metals. However, it is found that if forming fine recessed parts such as serrations on the inner surface of the conductor crimping part of the crimp terminal after a surface layer of an aluminum-based metal has been formed, there is a possibility that the surface layer of the aluminum-based metal is subjected to peeling or that a thin portion is produced in the conductor crimping part, so that such a defective portion causes the corrosion of the base material of the terminal, thereby exerting a harmful influence on the crimp terminal.

In the above-mentioned situation, an object of the present application is to provide a crimp terminal which is capable of preventing the occurrence of unnecessary corrosion because, despite the formation of a surface layer of a prescribed metal (e.g. aluminum-based metal) on an inner face of a conductor crimping part, there is no possibility that unnecessary peeling-off is produced on the surface layer or that the film thickness of the surface layer becomes uneven. Additionally, another object of the present application is to provide a manufacturing method of such a crimp terminal, a wire assembly, and a wire harness.

A crimp terminal according to a first aspect of the present application includes: a conductor crimping part whose base material is made of a first metal and which is to be crimped to a conductor of an electric wire, the conductor being made of a second metal; a plurality of fine recessed parts for promoting the adhesive performance of the conductor crimping part against the conductor, the fine recessed parts being formed, after an intermediate worked material having an unfolded shape of the crimp terminal has been formed by pressing either the base material made of the first metal and shaped like a flat plate or a material where a primary layer is formed on the surface of the base material, on a plate-body surface as an inner face of the conductor crimping part of the intermediate worked material; a thin-film surface layer made of the second metal, which is formed on at least the plate-body surface of the intermediate worked material after forming the fine recessed parts, the thin-film surface layer to be brought into contact with the conductor.

A manufacturing method of a crimp terminal according to a second aspect of the present application, that the crimp terminal includes: a conductor crimping part whose base material is made of a first metal and which is to be crimped to a conductor of an electric wire, the conductor being made of a second metal; and a thin-film surface layer formed on a contact surface as an inner surface of the conductor crimping part for contact with the conductor and also made of the second metal, includes: pressing either the base material made of the first metal and shaped like a flat plate or a material where a primary layer is formed on the surface of the base material, thereby forming an intermediate worked material having an unfolded shape of the crimp terminal; forming a plurality of fine recessed parts on a plate-body surface of the intermediate worked material providing an inner face of the conductor crimping part, for promoting the adhesive performance of the conductor crimping part against the conductor; forming the thin-film surface layer on at least the plate-body surface of the intermediate worked material after forming the fine recessed parts, the thin-film surface layer to be brought into contact with the conductor; and bending the intermediate worked material, on which the thin-film surface layer is formed, to a terminal shape.

An electric wire assembly according to a third aspect of the present application includes: a crimp terminal whose base material is made of a first metal; and a conductor as a core wire, to which the crimp terminal is crimped, the conductor being made of a second metal. The crimp terminal includes: a conductor crimping part crimped to the conductor; a plurality of fine recessed parts for promoting the adhesive performance of the conductor crimping part against the conductor, the fine recessed parts being formed, after an intermediate worked material having an unfolded shape of the crimp terminal has been formed by pressing either the base material made of the first metal and shaped like a flat plate or a material where a primary layer is formed on the surface of the base material, on a plate-body surface as an inner face of the conductor crimping part of the intermediate worked material; and a thin-film surface layer made of the second metal, which is formed on at least the plate-body surface of the intermediate worked material after forming the fine recessed parts, the thin-film surface layer being brought into contact with the conductor.

A wire harness according to a fourth aspect of the present application includes: a plurality of electric wire assemblies, each of which includes a crimp terminal whose base material is made of a first metal and a conductor as a core wire, to which the crimp terminal is crimped, the conductor being made of a second metal. The crimp terminal includes: a conductor crimping part crimped to the conductor; a plurality of fine recessed parts for promoting the adhesive performance of the conductor crimping part against the conductor, the fine recessed parts being formed, after an intermediate worked material having an unfolded shape of the crimp terminal has been formed by pressing either the base material made of the first metal and shaped like a flat plate or a material where a primary layer is formed on the surface of the base material, on a plate-body surface as an inner face of the conductor crimping part of the intermediate worked material; and a thin-film surface layer made of the second metal, which is formed on at least the plate-body surface of the intermediate worked material after forming the fine recessed parts, the thin-film surface layer being brought into contact with the conductor. The plurality of electric wires are bundled together to form a single entity.

With respective aspects of the present application, since the thin-film surface layer made of the second metal is formed on the inner surface of the conductor crimping part of the crimp terminal, it is possible to realize the contact between the second metals when crimping the conductor crimping part of the crimp terminal to the wire's conductor made of the second metal. Thus, it is possible to reliably prevent the electrolytic corrosion that could be caused on the contact surfaces of different kinds of metals. Further, the step of forming the thin-film surface layer of the second metal on the inner face of the conductor crimping part is performed after forming the fine recessed parts on the inner face of the conductor crimping part by pressing. Different from the case of forming the fine recessed parts after forming the thin-film surface layer of the second metal, therefore, there is no possibility that the thin-film surface layer of the second metal is subjected to unnecessary peeling or that the film thickness of the thin-film surface layer becomes uneven, so that it is possible to prevent the occurrence of unnecessary corrosion simply and reliably.

In the respective aspects of the present application, preferably, the first metal is a copper-based metal, while the second metal is an aluminum-based metal.

In the constitution, since the thin-film surface layer of the aluminum-based metal is formed on the inner surface of the conductor crimping part of the crimp terminal for aluminum wire, it is possible to realize the contact between the aluminum-based metals when crimping the conductor crimping part of the crimp terminal to the aluminum wire's conductor made of the aluminum-based metal. Thus, it is possible to reliably prevent the electrolytic corrosion that could be caused on the contact surfaces of different kinds of metals. Further, the step of forming the thin-film surface layer of the aluminum-based metal on the inner face of the conductor crimping part is performed after forming the fine recessed parts on the inner face of the conductor crimping part by pressing. Different from the case of forming the fine recessed parts after forming the thin-film surface layer of the aluminum-based metal, therefore, there is no possibility that the thin-film surface layer of the aluminum-based metal is subjected to unnecessary peeling or that the film thickness of the thin-film surface layer becomes uneven, so that it is possible to prevent the occurrence of unnecessary corrosion simply and reliably.

Also, with the wire harness related to the fourth aspect of the present application, since the occurrence of unnecessary corrosion can be prevented easily and reliably, it is possible to provide a wire harness having high connection reliability at low cost.

DETAILED DESCRIPTION

An embodiment will be described with reference to FIGS. 1 to 4, below.

Figure 1:
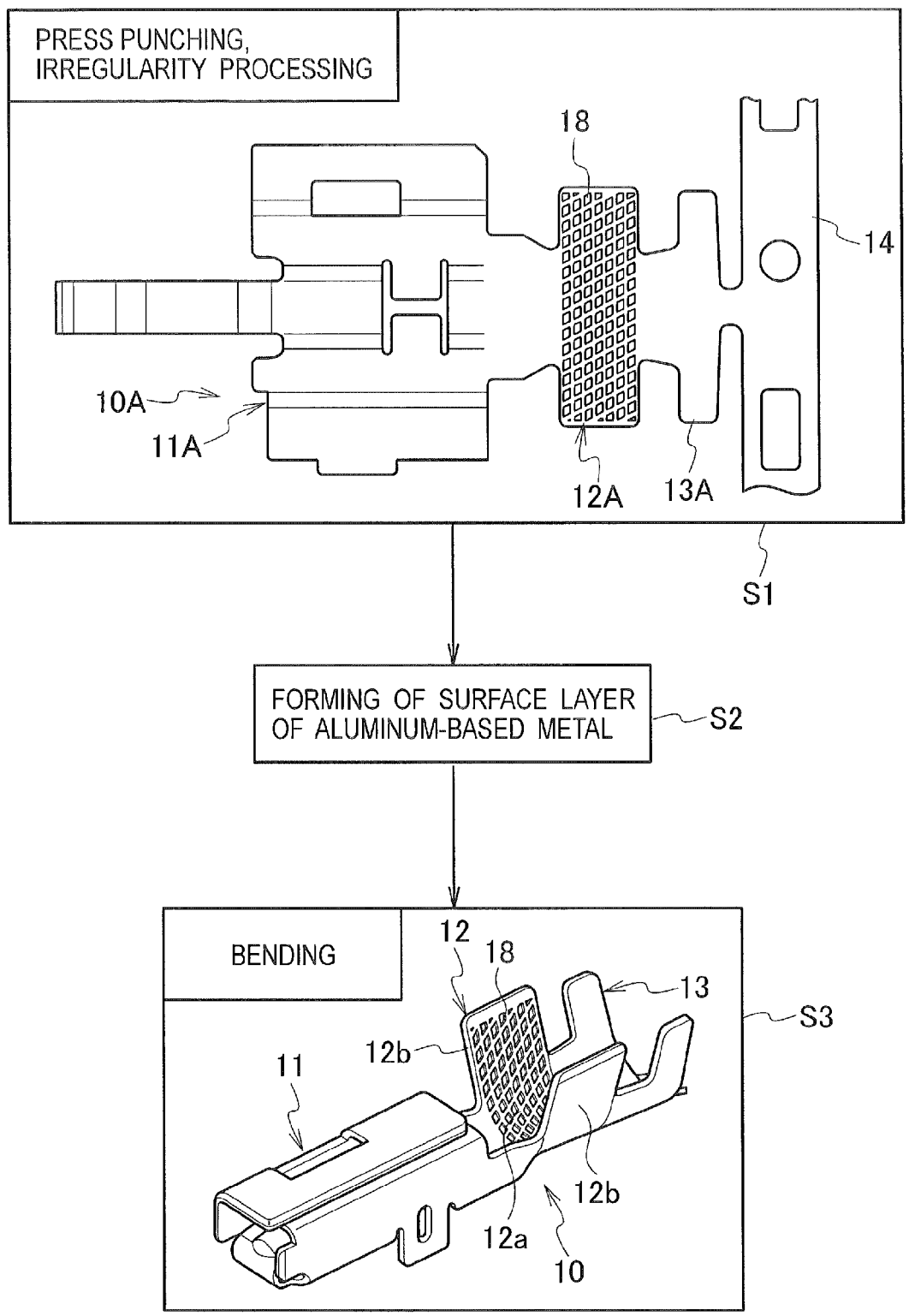
FIG. 1 is a process explanatory diagram of a manufacturing method of an aluminum wire crimp terminal according to an embodiment.
Figure 2:
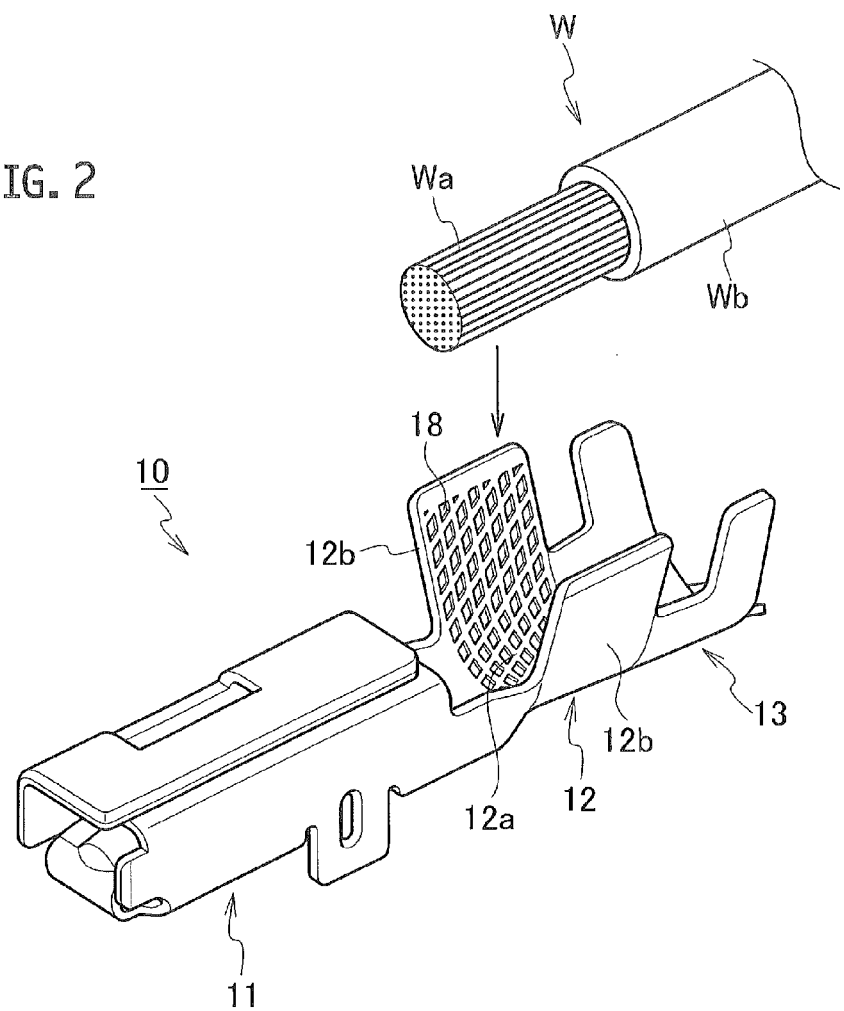
FIG. 2 is a perspective view illustrating a condition where an aluminum wire is about to be connected to the aluminum wire crimp terminal produced by the manufacturing method of FIG. 1.

FIG. 1 is a process explanatory diagram of a manufacturing method of an aluminum wire crimp terminal according to the embodiment, while FIG. 2 is a perspective view illustrating a condition where an aluminum wire is about to be connected to the aluminum wire crimp terminal produced by the manufacturing method of FIG. 1.

An aluminum wire crimp terminal 10 (female terminal in the embodiment) as a crimp terminal to be manufactured by the method of FIG. 1 includes, on its front side, an electrical connecting part 11 having a box shape which is electrically connectable to a mating terminal. The crimp terminal 10 includes, on its rear side, a conductor crimping part 12 as a wire connecting part having a substantial U-shaped cross section, and a cover crimping part 13 having a substantial U-shaped cross section and fixed to an insulating cover Wb of an electric wire W.

The conductor crimping part 12 is shaped to have a substantial U-shaped cross section including a bottom plate 12a and a pair of conductor crimp pieces 12b extending from both sides of the bottom plate 12a, which are crimped so as to wrap a conductor of the electric wire disposed on the inner face of the bottom plate 12a. The conductor crimping part 12 is provided, on its inner face, with a number of parallelogram fine recessed parts 18. Preferably, the size of each of the fine recessed parts 18 is established so as to correspond to the thickness of each of strands constituting the conductor Wa of the electric wire W.

In the aluminum wire crimp terminal 10, its base material is made of a copper-based metal (first metal). In the conductor crimping part 12, its inner face is formed, on at least its contact surface for contact with the aluminum conductor Wa of the electric wire W, with a thin-film surface layer made of an aluminum-based metal (i.e. second metal).

The electric wire W as an object to be crimped is an aluminum wire in which the aluminum conductor Wa as a core wire composed of a bundle of multiple strands of an aluminum-based metal (i.e. second metal) is covered with the insulating cover Wb, as illustrated in FIG. 2. In the aluminum wire crimp terminal 10, the conductor crimping part 12 having a substantial U-shaped cross section is a portion to be crimped and connected to the aluminum conductor Wa exposed by peeling the insulating cover Wb at an end of the aluminum wire W.

To manufacture the aluminum wire crimp terminal 10, the following steps will be executed in sequence.

First, as illustrated in step S1 of FIG. 1, an intermediate worked material 10A having an unfolded shape of the crimp terminal is punched out by pressing a base material (or a material where a primary layer is formed on the surface of the base material) in the form of a flat plate made of a copper-based metal. That is, it is performed to punch the intermediate worked material 10A having an unfolded shape, which includes a portion 11A for the electrical connecting part, a portion 12A for the conductor crimping part, and a portion 13A for the cover crimping part. Then, by pressing, a number of fine recessed parts 18 for promoting the adhesive performance of the conductor crimping part against the aluminum conductor Wa of the aluminum wire W are formed on a plate-body surface forming the inner face of the portion 12A for the conductor crimping part. Generally, as a plurality of intermediate worked materials 10A are pressed at the same time, one intermediate worked material 10A is connected to the other intermediate worked materials 10A through a connecting part 14 in a chain-like manner.

Then, in step S2, the thin-film surface layer of the aluminum-based metal is formed on at least a plate-body surface forming the inner face of the conductor crimping part of the intermediate worked material 10A. For the method of forming the thin-film surface layer of aluminum-based metal, there may be used a thin-film forming method by means of vapor deposition, spattering, non-electrolytic plating, or the like.

Then, in step S3, the intermediate worked material 10A is bent to a predetermined terminal shape.

Figure 3:
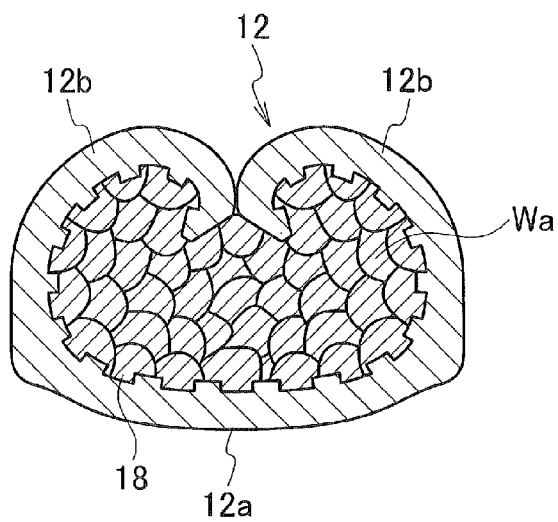
FIG. 3 is a cross sectional view of a portion of the aluminum wire crimp terminal where a conductor crimping part the crimp terminal is crimped to an aluminum conductor of the aluminum wire of FIG. 2.

In case of connecting the so-manufactured aluminum wire crimp terminal 10 to the aluminum wire W, it is performed to mount the end (front end) of the aluminum conductor Wa of the aluminum wire W on the bottom plate 12a of the conductor crimping part 12 of the aluminum wire crimp terminal 10, as illustrated in FIG. 2. Subsequently, the pair of conductor crimp pieces 12b are rounded inward to crimp them to the aluminum conductor Wa. Consequently, such a crimping portion of the conductor crimping part 12 becomes as illustrated in FIG. 3. Additionally, the cover crimping part 13 is also crimped to a certain portion of the insulating cover Wb of the aluminum wire W in the same manner.

In this way, when crimping the conductor crimping part 12 of the aluminum wire crimp terminal 10 to the aluminum conductor Wa of the aluminum wire W, the strands of the aluminum conductor Wa are deformed and pressed into the insides of the fine recessed parts 18. Then, by marginal edges of the fine recessed parts 18, respective oxide layers on the strands of the aluminum conductor Wa are broken to produce newly-formed surfaces and thereafter, the newly-formed surfaces and the conductor crimping part 12 are closely adhered to each other, thereby realizing the electrical connection between the aluminum wire crimp terminal 10 and the aluminum conductor Wa of the aluminum wire W.

Figure 4:
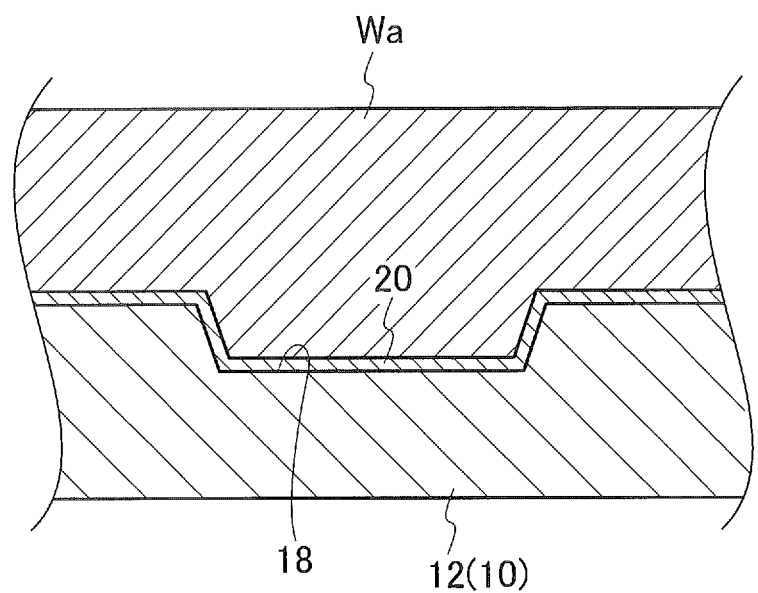
FIG. 4 is an enlarged sectional view of a portion of FIG. 3.

Also, as illustrated in FIG. 4 exaggeratedly, since the thin-film surface layer 20 of aluminum-based metal is formed on the inner surface of the conductor crimping part 12 of the aluminum wire crimp terminal 10, the contact between the conductor crimping part 12 and the conductor Wa of the aluminum wire is accomplished by respective contact surfaces of the aluminum-based metals. Therefore, it is possible to prevent the occurrence of electric corrosion, which could be generated between contact surfaces of different-kinds of metals, certainly.

Also, it is noted that the step of forming the thin-film surface layer 20 of aluminum-base metal on the inner face of the conductor crimping part 12 is carried out after forming the fine recessed parts 18 on the inner face of the conductor crimping part 12 by pressing. Thus, different from the case of forming the fine recessed parts 18 after forming the thin-film surface layer 20 of aluminum-base metal, there is no possibility that the thin-film surface layer 20 of aluminum-base metal is subjected to unnecessary peeling or that the film thickness of the thin-film surface layer 20 becomes uneven, so that it is possible to prevent the occurrence of unnecessary corrosion simply and reliably.

As illustrated in FIG. 2, additionally, since a plurality of wires W are assembled as one assembly by bundling a plurality of electric wires W, each of which is obtained by crimping the aluminum conductor Wa between the pair of conductor crimp pieces 12b of the conductor crimping part 12 of the aluminum wire crimp terminal 10, there is constructed a single combined-wires, that is, a wire harness. Further, as the contact between the conductor crimping part 12 of the aluminum wire crimp terminal 10 and the conductor Wa of the aluminum wire W is accomplished by respective contact surfaces of aluminum-based metals, the occurrence of unnecessary corrosion is prevented simply and reliably, whereby a wire harness having high connection reliability is provided at low cost.

Although the illustrated embodiment provides the aluminum wire crimp terminal and the aluminum wire as an example which uses copper-based metal, such as copper or copper alloy, as the first metal and aluminum-based metal, such as aluminum or aluminum alloy, as the second metal, the present application is also applicable to a crimp terminal having a conductor crimping part of the other material and an electrical wire having a conductor of the other material, for example, a crimp terminal for copper wire, which uses aluminum-based metal, such as aluminum or aluminum alloy, as the first metal and copper-based metal, such as copper or copper alloy, as the second metal, and a copper wire.

What is claimed is:

1. A crimp terminal, comprising:
a conductor crimping part whose base material is made of a first metal and which is to be crimped to a conductor of an electric wire, the conductor being made of a second metal;
a plurality of fine recessed parts provided on an inner face of the conductor crimping part for promoting an adhesive performance of the conductor crimping part against the conductor, the fine recessed parts being formed, after an intermediate worked material having an unfolded shape of the crimp terminal has been formed by pressing either the base material made of the first metal and shaped like a flat plate or a material where a primary layer is formed on the surface of the base material, on a plate-body surface as the inner face of the conductor crimping part of the intermediate worked material;
a thin-film surface layer made of the second metal on at least the inner face of the conductor crimping part provided with the plurality of fine recessed parts, which is formed on at least the plate-body surface of the intermediate worked material after forming the fine recessed parts, the thin-film surface layer to be brought into contact with the conductor.

2. The crimp terminal of claim 1, wherein the first metal is a copper-based metal, while the second metal is an aluminum-based metal.

3. A wire assembly, comprising:
a crimp terminal whose base material is made of a first metal; and
a conductor as a core wire, to which the crimp terminal is crimped, the conductor being made of a second metal,
the crimp terminal comprising:
a conductor crimping part crimped to the conductor;
a plurality of fine recessed parts provided on an inner face of the conductor crimping part for promoting an adhesive performance of the conductor crimping part against the conductor, the fine recessed parts being formed, after an intermediate worked material having an unfolded shape of the crimp terminal has been formed by pressing either the base material made of the first metal and shaped like a flat plate or a material where a primary layer is formed on the surface of the base material, on a plate-body surface as the inner face of the conductor crimping part of the intermediate worked material; and
a thin-film surface layer made of the second metal on at least the inner face of the conductor crimping part provided with the plurality of fine recessed parts, which is formed on at least the plate-body surface of the intermediate worked material after forming the fine recessed parts, the thin-film surface layer being brought into contact with the conductor.

4. The wire assembly of claim 3, wherein the first metal is a copper-based metal, while the second metal is an aluminum-based metal.

5. A wire harness, comprising:
a plurality of wire assemblies each comprising a crimp terminal whose base material is made of a first metal, and a conductor as a core wire, to which the crimp terminal is crimped, the conductor being made of a second metal,
the crimp terminal comprising:
a conductor crimping part crimped to the conductor;
a plurality of fine recessed parts provided on an inner face of the conductor crimping part for promoting an adhesive performance of the conductor crimping part against the conductor, the fine recessed parts being formed, after an intermediate worked material having an unfolded shape of the crimp terminal has been formed by pressing either the base material made of the first metal and shaped like a flat plate or a material where a primary layer is formed on the surface of the base material, on a plate-body surface as the inner face of the conductor crimping part of the intermediate worked material; and
a thin-film surface layer made of the second metal on at least the inner face of the conductor crimping part provided with the plurality of fine recessed parts, which is formed on at least the plate-body surface of the intermediate worked material after forming the fine recessed parts, the thin-film surface layer being brought into contact with the conductor, wherein
the plurality of electric wires are bundled together to form a single entity.

6. The wire harness of claim 5, wherein the first metal is a copper-based metal, while the second metal is an aluminum-based metal.

7. The crimp terminal of claim 1, wherein the fine recessed parts comprise a number of parallelogram shaped fine recessed parts.

8. The crimp terminal of claim 1, wherein a size of each of the fine recessed parts corresponds to a thickness of the conductor of the electric wire.

9. The wire assembly of claim 3, wherein the fine recessed parts comprise a number of parallelogram shaped fine recessed parts.

10. The wire assembly of claim 3, wherein a size of each of the fine recessed parts corresponds to a thickness of the conductor of the electric wire.

11. The wire harness of claim 5, wherein the fine recessed parts comprise a number of parallelogram shaped fine recessed parts.

12. The wire harness of claim 5, wherein a size of each of the fine recessed parts corresponds to a thickness of the conductor of the electric wire.

* * * * *